United States Patent
Merrill (12)

(10) Patent No.: US 6,180,983 B1
(45) Date of Patent: Jan. 30, 2001

(54) HIGH-VOLTAGE MOS TRANSISTOR ON A SILICON ON INSULATOR WAFER

(75) Inventor: Richard Billings Merrill, Woodside, CA (US)

(73) Assignee: National Semiconductor Corporation, Santa Clara, CA (US)

(*) Notice: Under 35 U.S.C. 154(b), the term of this patent shall be extended for 0 days.

(21) Appl. No.: 09/118,460

(22) Filed: Jul. 17, 1998

(51) Int. Cl.[7] .................................................. H01L 27/01
(52) U.S. Cl. ...................... 257/347; 257/408; 257/351; 438/286
(58) Field of Search ................................... 257/335, 347, 257/351, 408; 438/286

(56) References Cited

U.S. PATENT DOCUMENTS

| | | | |
|---|---|---|---|
| H1435 | * 5/1995 | Cherne et al. ..................... 257/347 |
| 4,965,213 | 10/1990 | Blake ................................... 437/21 |
| 5,366,916 | 11/1994 | Summe et al. ......................... 437/44 |
| 5,654,573 | * 8/1997 | Oashi et al. ......................... 257/347 |
| 5,891,782 | * 4/1999 | Hsu et al. ............................ 438/302 |
| 5,929,490 | * 7/1999 | Onishi ................................. 257/347 |

* cited by examiner

Primary Examiner—Mark V. Prenty
(74) Attorney, Agent, or Firm—Limbach & Limbach L.L.P.

(57) ABSTRACT

High-voltage n-channel and p-channel MOS transistors are formed on an insulated wafer, such as a silicon-on-insulator wafer. The heavily-doped area of the drain region is separated from the channel region by a lighter-doped area of the drain region which has a lateral width which is substantially greater than the lateral width of the sidewall spacers formed adjacent to the gates of the spacers.

18 Claims, 7 Drawing Sheets

HIGH-VOLTAGE MOS TRANSISTOR ON A SILICON ON INSULATOR WAFER

BACKGROUND OF THE INVENTION

1. Field of the Invention

The present invention relates to high-voltage MOS transistors and, more particularly, to a high-voltage MOS transistor which is formed on a silicon on insulator (SOI) wafer.

2. Description of the Related Art

A MOS transistor is a device that controls a channel current, which flows from the drain to the source of the transistor, in response to a voltage applied to the gate of the transistor. As a result of this ability to control the channel current, MOS transistors are commonly used as voltage-controlled switches where the transistor provides a very-low resistance current path when turned on, and a very-high resistance current path when turned off.

FIGS. 1A–1B show cross-sectional and schematic diagrams, respectively, that illustrate a conventional n-channel MOS transistor 100. As shown in FIGS. 1A–1B, transistor 100 includes spaced-apart n+ source and drain regions 114 and 116 which are formed in a p-type substrate 112, and a channel region 118 which is defined between source and drain regions 114 and 116. In addition, transistor 100 also includes a dielectric layer 120 which is formed over channel region 118, and a gate 122 which is formed over dielectric layer 120.

In operation, transistor 100 turns on when the drain-to-source voltage $V_{DS}$ is positive, the drain-to-substrate junction is reverse-biased, and the gate-to-source voltage $V_{GS}$ is equal to or greater than the threshold voltage $V_T$. Often, the positive drain-to-source voltage $V_{DS}$ and the reverse-biased drain-to-substrate junction are set by tying substrate 112 and source region 114 to ground, and applying a positive voltage to drain region 116.

With source region 114 tied to ground, a gate-to-source voltage $V_{GS}$ which is greater than the threshold voltage $V_T$ may be obtained by simply applying a voltage to gate 122 which is equal to or greater than the threshold voltage $V_T$. When these conditions are met and transistor 100 turns on, a channel current $I_C$ flows from drain region 116 to source region 114. On the other hand, to turn transistor 100 off, and stop the channel current $I_C$ from flowing, the voltage on gate 122 may be simply lowered so that the gate voltage is less than the threshold voltage $V_T$.

MOS transistors may be used in both low-voltage and high-voltage environments. High-voltage MOS transistors, however, must be able to withstand significantly larger drain voltages without inducing avalanche breakdown.

Avalanche breakdown occurs when the voltage on the drain region is so large that the electric field across the reverse-biased drain-to-substrate junction accelerates thermally-generated electron-hole pairs at or near the junction. The accelerated electron-hole pairs have ionizing collisions with the lattice which form additional electron-hole pairs that quickly multiply to form a large avalanche current.

This large avalanche current, in turn, has numerous detrimental effects on the operation of a high-voltage transistor.

One technique for reducing the strength of the junction electric field of a high-voltage transistor is to surround the drain region with a lightly-doped region of the same conductivity type. FIG. 2 shows a cross-sectional diagram of a high-voltage n-channel MOS transistor 200 that illustrates this technique.

As shown in FIG. 2, high-voltage transistor 200, like transistor 100, has spaced-apart source and drain regions 214 and 216 which are formed in a p-type substrate 212, and a channel region 218 which is defined between source and drain regions 214 and 216. In addition, transistor 200 also has a dielectric layer 220 which is formed over channel region 218, and a gate 222 which is formed over dielectric layer 220.

As further shown in FIG. 2, transistor 200 principally differs from transistor 100 in that drain region 216 includes a n+ region 216A and a n− region 216B which surrounds n+ region 216A. The purpose of n− region 216B, which is formed as an n− well, is to absorb some of the potential of n+ region 216A, and thereby reduce the strength of the junction electric field.

High-voltage MOS transistors are typically used in output circuits that often require both high-voltage n and p-channel transistors. FIG. 3 shows a cross-sectional diagram of a portion of an output circuit 300 that illustrates the use of both high-voltage n-channel and p-channel MOS transistors.

As shown in FIG. 3, circuit 300 includes high-voltage n-channel transistor 200, and a high-voltage p-channel transistor 310. P-channel transistor 310 includes spaced-apart p+ source and drain regions 314 and 316 which are formed in a deep n-well 312 which, in turn, is formed in p-type substrate 212. Further, drain region 316 of p-channel transistor 310 includes a p+ region 316A and a p− region 316B which is formed from a p-well.

In addition, transistor 310 also includes a channel region 318 which is defined between source and drain regions 314 and 316, a dielectric layer 320 which is formed over channel region 318, and a gate 322 which is formed over dielectric layer 320.

One problem with output circuit 300, however, is that transistor 310 can not be formed with a standard CMOS process because conventional CMOS logic transistors do not require a deep well structure, such as deep n-well 312. In addition, conventional bulk CMOS wafers are typically unable to accommodate a deep well structure.

As a result, high-voltage n-channel and p-channel transistors can not be incorporated onto a chip having CMOS logic circuitry without using non-standard bulk wafers, and altering the fabrication process. Both of these steps, however, add additional cost and complexity to the process and the finished result.

Thus, there is a need for n-channel and p-channel high-voltage MOS transistors which can be incorporated into a standard CMOS process.

SUMMARY OF THE INVENTION

Conventionally, high-voltage n-channel and p-channel MOS transistors can not be formed with a standard CMOS fabrication process because the high-voltage transistors require a deep well structure which, in turn, requires additional masking steps. The present invention allows both n-channel and p-channel high-voltage MOS transistors to be formed with a standard CMOS process when the CMOS logic transistors are formed on an insulated wafer, such as a silicon on insulator semiconductor wafer.

In accordance with the present invention, a semiconductor device comprises a semiconductor wafer and a high-voltage transistor. The semiconductor wafer includes a substrate, a first layer of insulation material which is formed on the substrate, and a layer of semiconductor material which is formed on the layer of insulation material.

The high-voltage transistor includes spaced-apart source and drain regions of a first conductivity type which are formed in the semiconductor material. The drain region has a first area with a first dopant concentration and a second area with a second dopant concentration which is less than the first dopant concentration. In addition, the second area contacts the first layer of insulation material.

The high-voltage transistor also includes a first region which is formed in the semiconductor material between the source and drain regions, a second layer of insulation material which is formed on the semiconductor material, and a gate which is formed on the second layer of insulation material over the first region and a portion of the second area.

The high-voltage transistor further includes spacers which are formed to contact the sidewalls of the gate. The spacers have a lateral width which is substantially smaller than the lateral width of the second area.

A better understanding of the features and advantages of the present invention will be obtained by reference to the following detailed description and accompanying drawings which set forth an illustrative embodiment in which the principles of the invention are utilized.

DETAILED DESCRIPTION

Figure 1A:
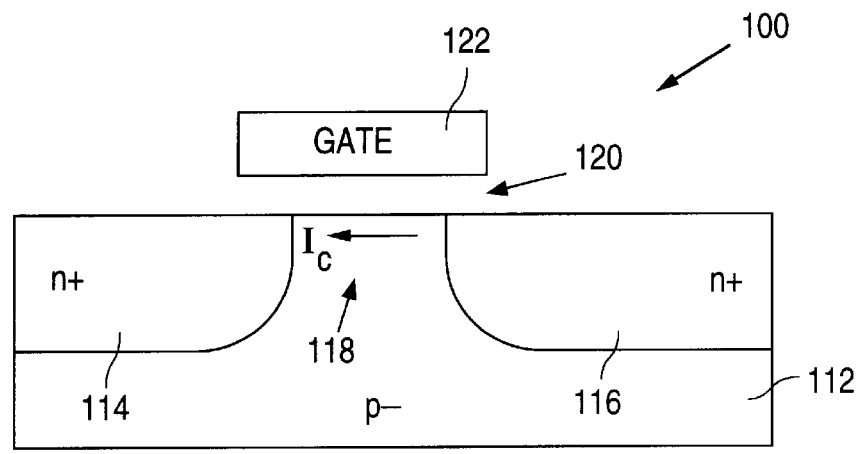
FIGS. 1A–1B are cross-sectional and schematic diagrams, respectively, illustrating a conventional n-channel MOS transistor 100.
Figure 1B:
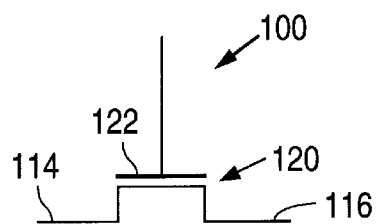
Figure 2:
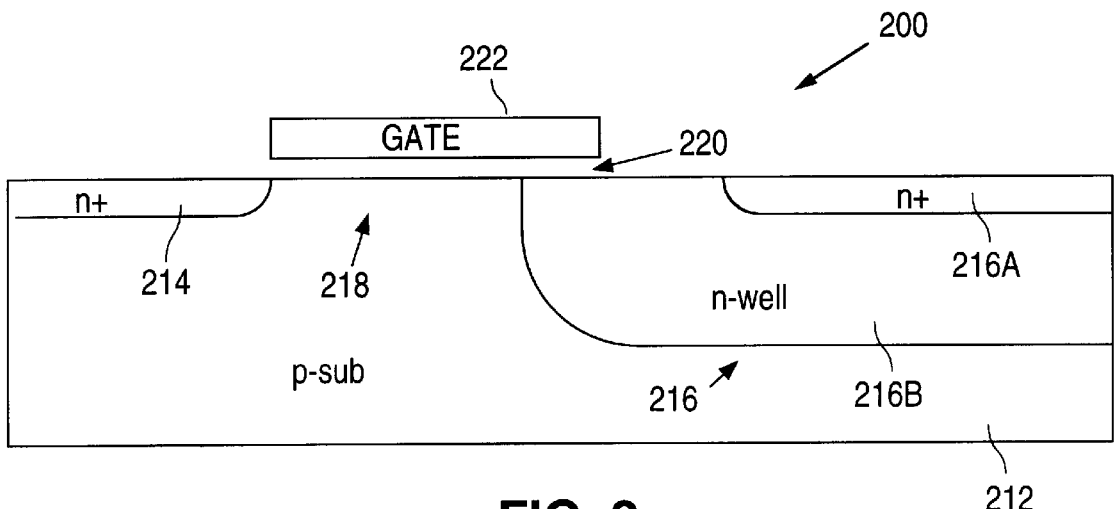
FIG. 2 is a cross-sectional diagram illustrating a conventional high-voltage n-channel MOS transistor 200.
Figure 3:
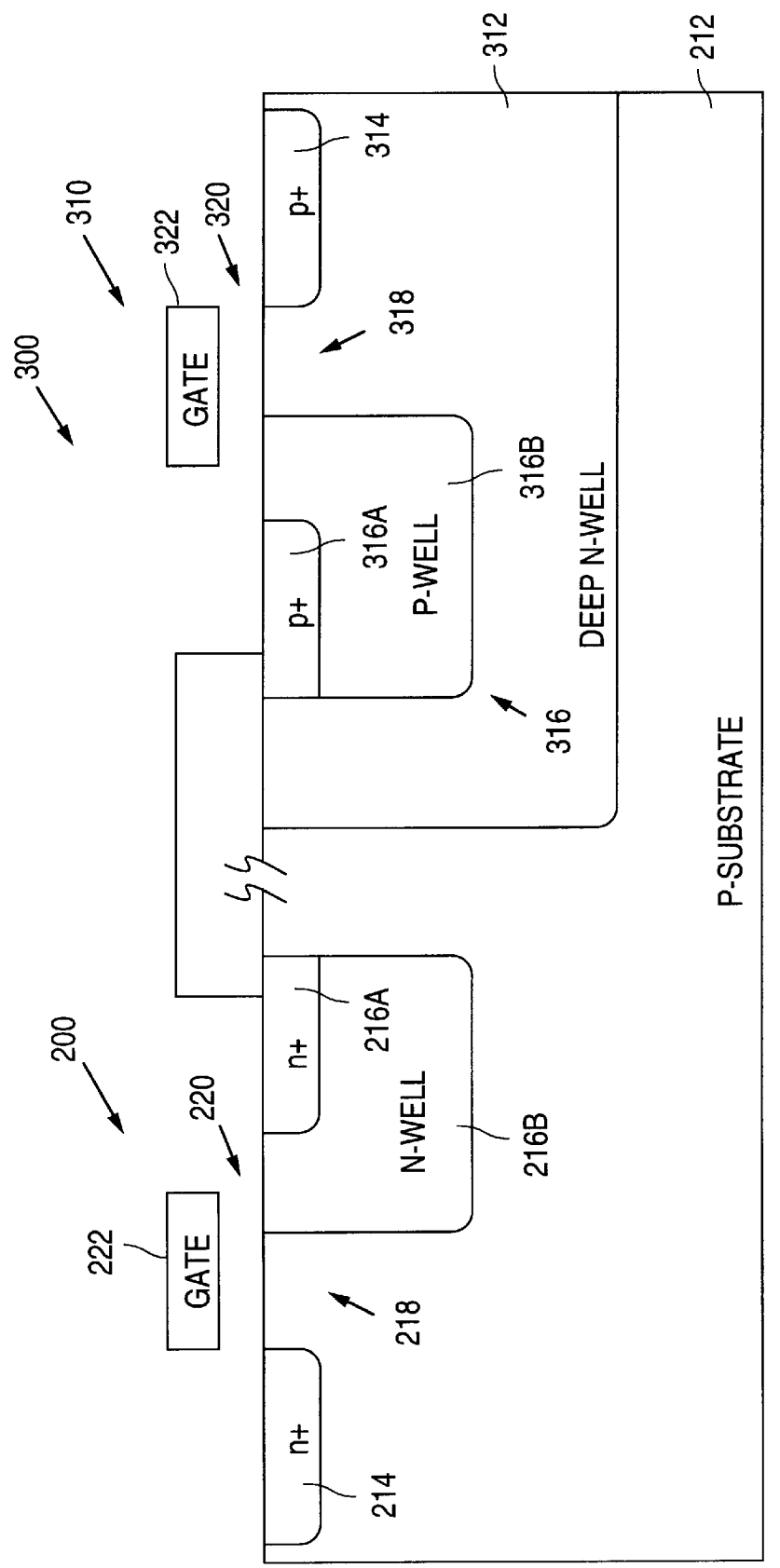
FIG. 3 is a cross-sectional diagram of a portion of a conventional output circuit 300 illustrating the use of both high-voltage n-channel and p-channel MOS transistors.
Figure 4A:
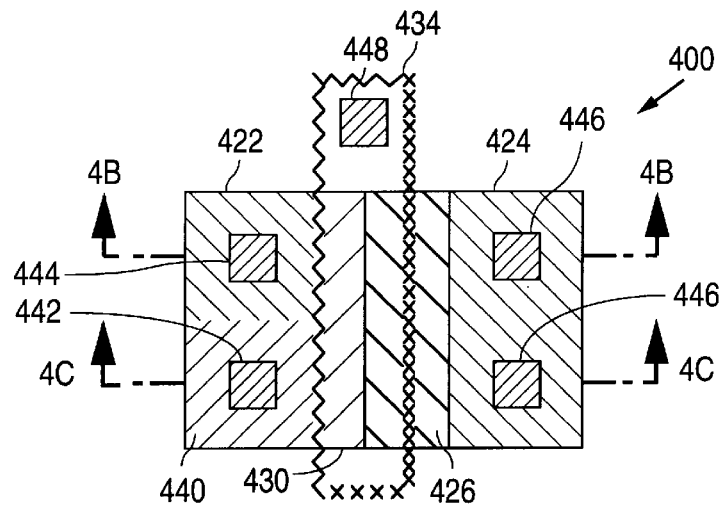
FIG. 4A is a plan view illustrating a semiconductor device 400 in accordance with the present invention.

FIG. 4A shows a plan view that illustrates a semiconductor device 400 in accordance with the present invention.

Figure 4B:
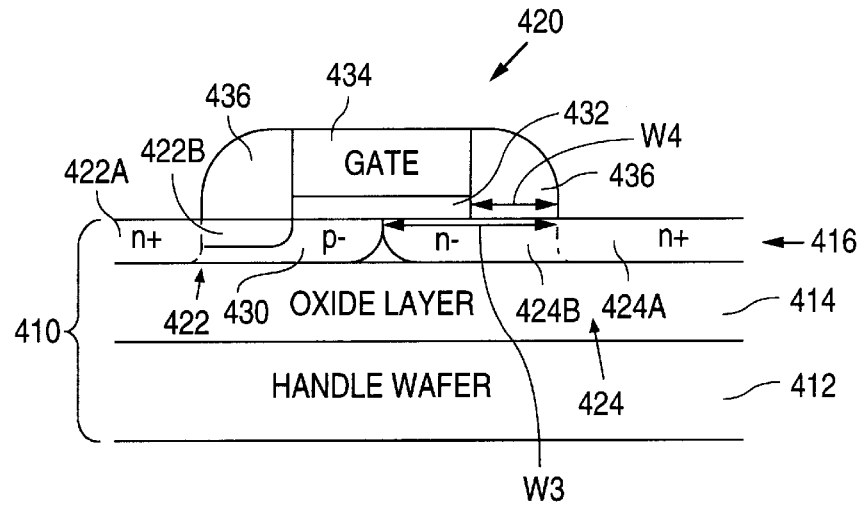
FIG. 4B is a cross-sectional view taken along line 4B—4B of FIG. 4A.
Figure 4C:
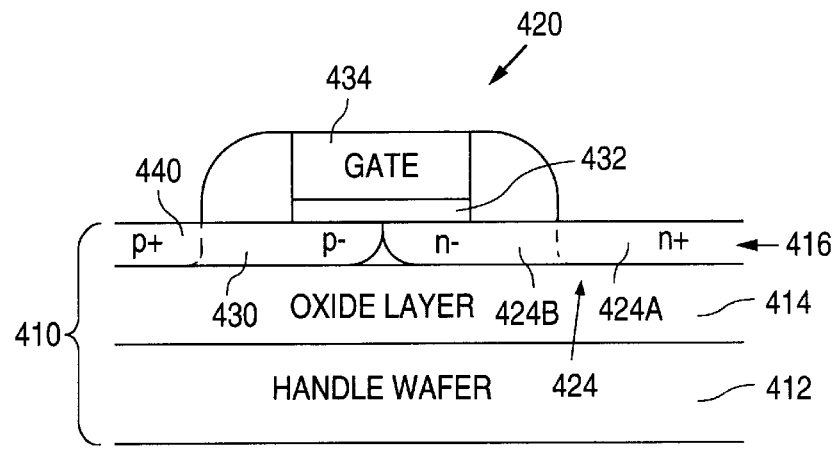
FIG. 4C is a cross-sectional view taken along line 4C—4C of FIG. 4A.

FIG. 4B shows a cross-sectional view taken along line 4B13 4B of FIG. 4A, while FIG. 4C shows a cross-sectional view taken along line 4C—4C of FIG. 4A.

As shown in FIGS. 4A–4C, device 400 includes a semiconductor wafer 410 and a high-voltage n-channel MOS transistor 420. Wafer 410 includes a substrate 412, a layer of insulation material 414 which is formed on substrate 412, and a layer of semiconductor material 416 which is formed on insulation layer 414. Insulation layer 414 may be formed, for example, from silicon dioxide, while semiconductor layer 416 may be formed, for example, from single-crystal silicon.

Transistor 420, in turn, includes spaced-apart source and drain regions 422 and 424 which are formed in semiconductor layer 416, and a p-well region 430 which is formed in semiconductor layer 416 between source and drain regions 422 and 424.

Source region 422 includes a n+ region 422A and a n– region 422B, while drain region 424 includes a n+ region 424A and a n– region 424B. As described in greater detail below, n– region 424B has a higher dopant concentration than does n– region 422B.

In addition, transistor 420 also includes a layer of insulation material 432 which is formed on semiconductor layer 416, and a gate 434 which is formed on insulation layer 432 over the top surface of p-well region 430 and a portion of n– region 424B. Gate 434 may be formed, for example, from aluminum, doped polysilicon, or doped polysilicon with an overlying layer of metal silicide, while insulation layer 432 may be formed, for example, from gate oxide.

Transistor 420 further includes spacers 436 (not shown in FIG. 4A) which are formed to contact the sidewalls of insulation layer 432 and gate 434, and a p+ contact region 440 which is formed in semiconductor material 416 adjacent to source region 422 and p-well region 430.

Contact region 440 allows a predefined voltage (such as the source voltage) to be placed on p-well region 430, while a plurality of contacts 442, 444, 446, and 448 are used to connect p+ region 440, source region 422, drain region 424, and gate 434, respectively, to the nodes of a circuit.

One of the advantages of the present invention is that, when CMOS logic transistors are formed on a wafer like wafer 410, transistor 420 may be formed at the same time without any additional masking steps. In the present invention, n– region 424B and p-well region 430 are formed at the same time that the n-and p– wells or tubs of a CMOS logic device are formed. (The top surface of p-well region 430 functions as the channel of transistor 420, and is approximately 2× longer than the minimum length due to the requirement for overlay tolerances in the channel).

In addition, source region 422B is formed at the same time that the LDD structures of the CMOS device are formed, and source and drain regions 422A and 424A are formed at the same time that the source and drain regions of the CMOS logic device are formed. Since n– region 424B is formed at the same time that the wells or tubs of the CMOS logic device are formed, n– region 424B has a dopant concentration which is higher than the dopant concentration of n– region 422B.

Figure 5:
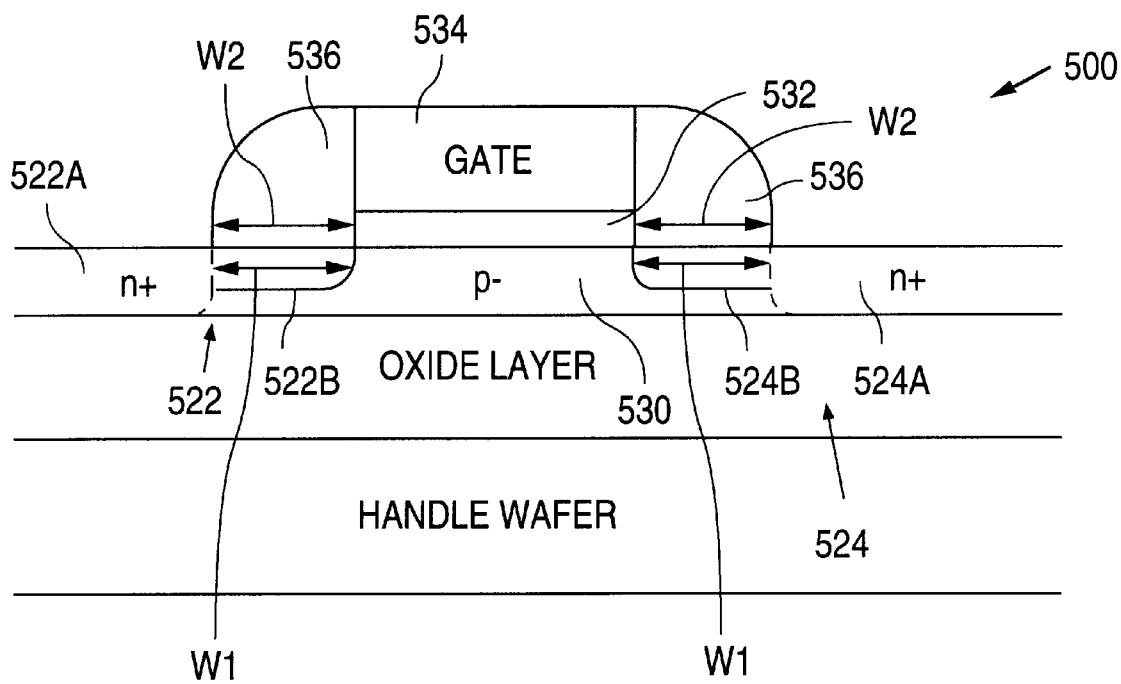
FIG. 5 is a cross-sectional view illustrating a conventional n-channel MOS transistor 500 which is formed on a semiconductor wafer, such as wafer 410.

FIG. 5 shows a cross-sectional view that illustrates a conventional n-channel MOS transistor 500 which is formed on a semiconductor wafer, such as wafer 410. As shown in FIG. 5, transistor 500 includes spaced-apart source and drain regions 522 and 524 which are formed in a semiconductor layer, and a p-type region 530 which is formed in the semiconductor layer between source and drain regions 522 and 524.

Source region 522 includes a n+ region 522A and a n− region 522B, while drain region 524 includes a n+ region 524A and a n− region 524B. N− regions 522B and 524B are lightly-doped-drain (LDD) regions which have the same dopant concentration.

In addition, prior-art transistor 500 also includes a layer of insulation material 532 which is formed on the semiconductor layer, a gate 534 which is formed on insulation layer 532 over p-type region 530 and a portion of LDD regions 522B and 524B, and spacers 536 which are formed to contact the sidewalls of insulation layer 532 and gate 534.

Comparing transistor 420 of the present invention with prior-art transistor 500 illustrates several differences. First, the lateral width W1 of LDD regions 522B and 524B is approximately as wide as the lateral width W2 of spacers 536. This is because LDD regions 522B and 524B are typically formed in a self-aligned implant that uses gate 534 (or gate 534 and an overlying mask) as the mask for the LDD implant, while n+ source and drain regions 522A and 524A are formed in a subsequent self-aligned implant that uses spacers 536 as the mask for the implant.

In contrast, as shown in FIG. 4B, the lateral width W3 of n− region 424B is substantially larger than the lateral width W4 of spacers 436. This is because n− region 424B and p-well region 430 are formed prior to the formation of gate 434, during the same time that the n− and p− wells or tubs of the CMOS logic device are formed.

The advantage of forming n− region 424B to have a lateral width which is substantially greater than the lateral width of the spacers is that the maximum drain voltage which can be handled by transistor 420 is substantially increased.

Another difference between transistor 420 of the present invention and prior-art transistor 500 is that LDD regions 522B and 524B do not extend down to contact insulation layer 414. On the other hand, since n− region 424B is formed during the formation of the CMOS well implants, n− region 424B extends down and contacts insulation layer 414.

The advantage of forming n− region 424B to contact insulation layer 414 is that the voltage along the entire drain junction is reduced, thereby preventing avalanche breakdown from occuring anywhere along the entire drain junction.

A further difference is that since n− region 424B is formed during the CMOS well implant step rather than during the LDD implant step, the dopant concentration of n− region 424B is greater than the dopant concentration of LDD regions 522A and 524A (and LDD region 422B).

Although transistor 420 may be formed at the same time that CMOS logic transistors are formed without any additional masking steps, the maximum drain voltage which can be handled by transistor 420 can be further increased by utilizing additional masking steps to form a thicker layer of gate oxide, or to space drain region 424A apart from spacer 436.

Figure 6:
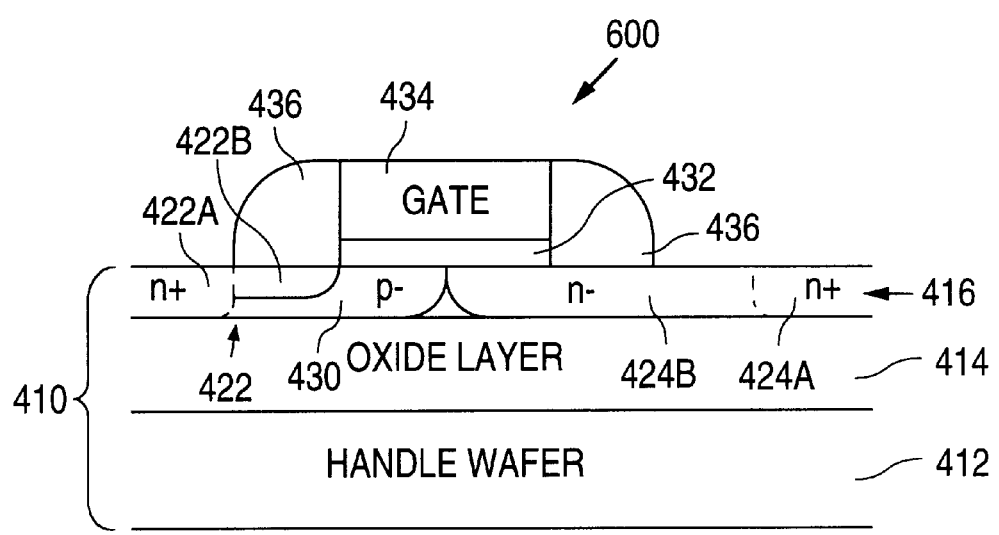
FIG. 6 is a cross-sectional view illustrating a high-voltage n-channel MOS transistor 600 in accordance with a first alternate embodiment of the present invention.

FIG. 6 shows a cross-sectional view that illustrates a high-voltage n-channel MOS transistor 600 in accordance with a first alternate embodiment of the present invention. As shown in FIG. 6, transistor 600 is the same as transistor 420 except that drain region 424A of transistor 600 is laterally spaced-apart from the bottom edge of spacer 436.

Figure 7A:
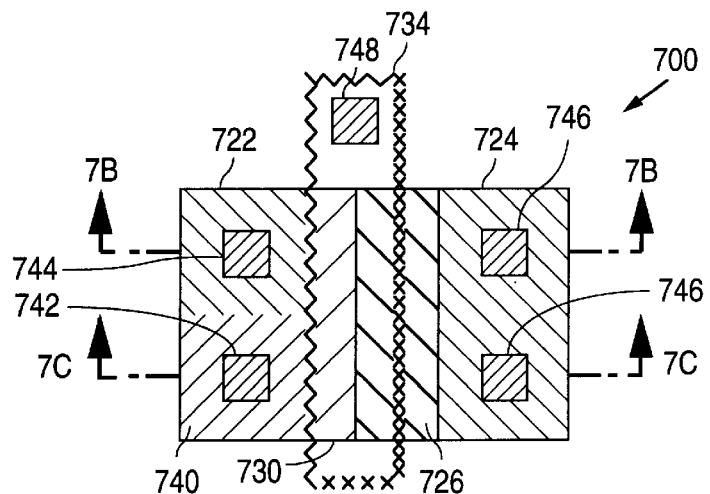
FIG. 7A is a plan view illustrating a semiconductor device 700 in accordance with the present invention.
Figure 7B:
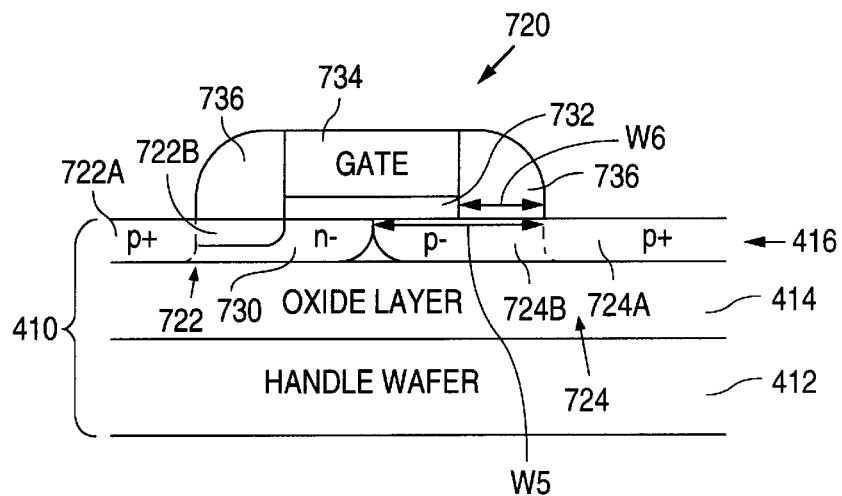
FIG. 7B is a cross-sectional view taken along line 7B—7B of FIG. 7A.

In addition to n-channel MOS transistors, p-channel MOS transistors may also be formed in semiconductor layer 416 by simply reversing the conductivity types of the different regions. FIG. 7A shows a plan view that illustrates a semiconductor device 700 in accordance with the present invention. FIG. 7B shows a cross-sectional view taken along line 7B—7B of FIG. 7A, while FIG. 7C shows a cross-sectional view taken along line 7C—7C of FIG. 7A.

Figure 7C:
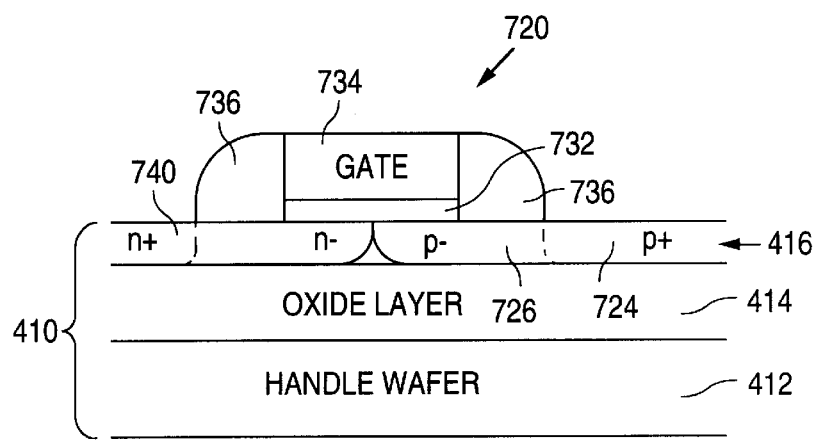
FIG. 7C is a cross-sectional view taken along line 7C—7C of FIG. 7A.

As shown in FIGS. 7A–7C, device 700 includes semiconductor wafer 410, and a p-channel transistor 720. Transistor 720, in turn, includes spaced-apart source and drain regions 722 and 724 which are formed in semiconductor layer 416, and a n-well region 730 which is formed in semiconductor layer 416 between source and drain regions 722 and 724.

Source region 722 includes a p+ region 722A and a p− region 722B, while drain region 724 includes a p+ region 724A and a p− region 724B. As described in greater detail below, p− region 724B has a higher dopant concentration than does p− region 722B.

In addition, transistor 720 also includes an insulation layer 732 which is formed on semiconductor layer 416, and a gate 734 which is formed on insulation layer 732 over the top surface of n-well region 730 and a portion of p− region 724B. Gate 734 may be formed from the same materials as gate 434.

Transistor 720 further includes spacers 736 (not shown in FIG. 7A) which are formed to contact the sidewalls of insulation layer 732 and gate 734, and a n+ contact region 740 which is formed in semiconductor material 416 adjacent to source region 722 and n-well region 730.

Contact region 740 allows a predefined voltage (such as the source voltage) to be placed on n-well region 730, while a plurality of contacts 742, 744, 746, and 748 are used to connect n+ region 740, source region 722, drain region 724, and gate 734, respectively, to the nodes of a circuit.

As with transistor 420, transistor 720 may also be formed at the same time that CMOS logic transistors are formed without any additional masking steps when the CMOS logic transistors are formed on a wafer like wafer 410. P− region 724B and n-well region 730 are formed at the same time that the n-and p− wells or tubs of a CMOS logic device are formed. (The top surface of n-well region 730 functions as the channel of transistor 720, and is approximately 2× longer than the minimum length due to the requirement for overlay tolerances in the channel).

In addition, source region 722B is formed at the same time that the LDD structures of the CMOS device are formed, and source and drain regions 722A and 724A are formed at the same time that the source and drain regions of the CMOS logic device are formed. Since p− region 724B is formed at the same time that the wells or tubs of the CMOS logic device are formed, p− region 724B has a dopant concentration which is higher than the dopant concentration of p− region 722B.

Figure 8:
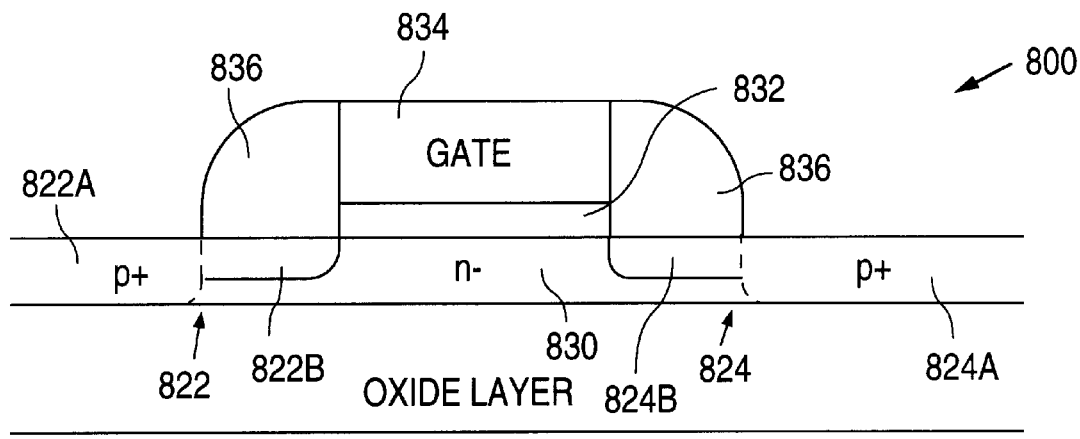
FIG. 8 is a cross-sectional view illustrating a conventional p-channel MOS transistor 800 which is formed on a semiconductor wafer, such as wafer 410.

FIG. 8 shows a cross-sectional view that illustrates a conventional p-channel MOS transistor 800 which is formed on a semiconductor wafer, such as wafer 410. As shown in FIG. 8, transistor 800 includes spaced-apart source and drain regions 822 and 824 which are formed in a semiconductor layer, and a n-type region 830 which is formed in the semiconductor layer between source and drain regions 822 and 824.

Source region 822 includes a p+ region 822A and a p− region 822B, while drain region 824 includes a p+ region 824A and a p− region 824B. P− regions 822B and 824B are lightly-doped-drain (LDD) regions which have the same dopant concentration.

In addition, prior-art transistor 800 also includes a layer of insulation material 832 which is formed on the semiconductor layer, a gate 834 which is formed on insulation layer 832 over n-type region 830 and a portion of LDD regions 822B and 824B, and spacers 836 which are formed to contact insulation layer 832 and the sidewalls of gate 834.

As with transistor 420, transistor 720 differs from prior-art transistor 800 in that the lateral width W5 of p– region 724B (see FIG. 7B) is substantially larger than the lateral width W6 of spacer 736. In addition, p– region 724B extends down and contacts insulation layer 414, while LDD regions 822B and 824B of transistor 800 do not extend down to contact insulation layer 414. Further, the doping concentration of p– region 724B is greater than the doping concentration of LDD regions 822B and 824B (and LDD region 722B).

In addition, transistor 720, like transistor 420, may be formed with additional masking steps to form a thicker layer of gate oxide, or to laterally space drain region 724A apart from spacer 736, thereby increasing the maximum drain voltage that can be handled by transistor 720.

Figure 9:
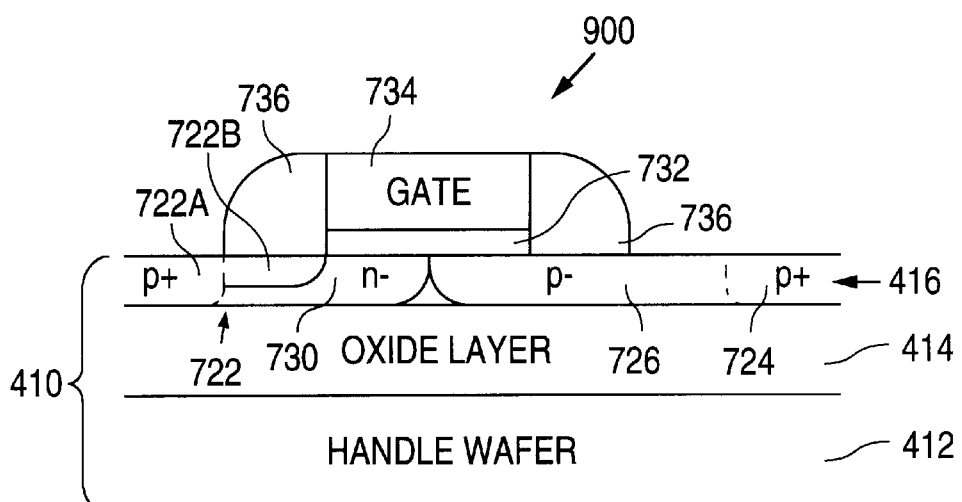
FIG. 9 is a cross-sectional view illustrating a high-voltage p-channel MOS transistor 900 in accordance with a second alternate embodiment of the present invention.

FIG. 9 shows a cross-sectional view that illustrates a high-voltage p-channel MOS transistor 900 in accordance with a second alternate embodiment of the present invention. As shown in FIG. 9, transistor 900 is the same as transistor 720 except that drain region 724A of transistor 900 is laterally spaced-apart from the bottom edge of spacer 736.

Figure 10:
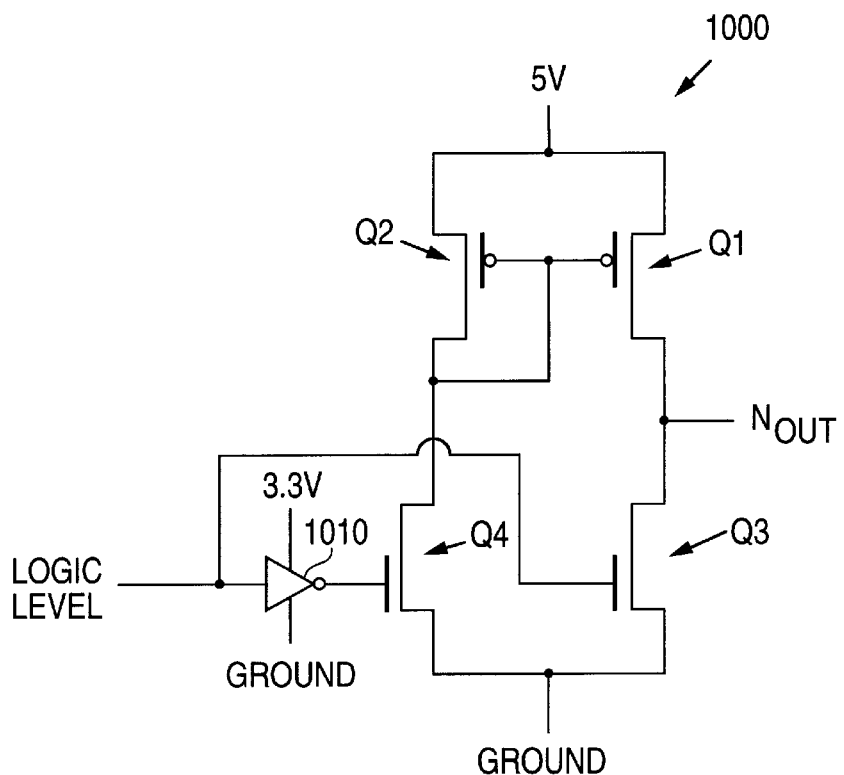
FIG. 10 is a schematic diagram of a level shifter circuit 1000 illustrating how devices 400 and 700 can be used to address the 3V/5V tolerance issue in accordance with the present invention.

Another advantage of the present invention is that high-voltage transistors 420/600 and 720/900 resolve the historical requirement of 5V tolerance for low-voltage, e.g., 3.3V, CMOS circuits. FIG. 10 shows a schematic diagram of a level shifter circuit 1000 that illustrates how devices 400 and 700 can be used to address the 3V/5V tolerance issue. Access to a 5V supply is assumed as 5V must be available in any situation where 5V tolerance is required.

As shown in FIG. 10, circuit 1000 includes a high-voltage p-channel transistor Q1 which has a source connected to a 5V line, a drain connected to an output node $N_{OUT}$, and a gate; and a high-voltage p-channel transistor Q2 which has a source connected to the 5V line, a drain, and a gate connected to the gate of transistor Q1 and the drain of transistor Q2 as a current mirror.

In addition, circuit 1000 also includes a high-voltage n-channel transistor Q3 which has a source connected to ground, a drain connected to output node $N_{OUT}$, and a gate; and a high-voltage n-channel transistor Q4 which has a source connected to ground, a drain connected to the drain of transistor Q2, and a gate. Transistors Q1, Q2, Q3, and Q4 are formed in accordance with the present invention.

Further, circuit 1000 additionally includes an inverter 1010 which has an input connected to receive a logic level signal and to the gate of transistor Q3, and an output that is connected to the gate of transistor Q4.

In operation, when the logic level signal is in a first logic state, transistor Q3 is turned off, while transistors Q1, Q2, and Q4 are turned on. Transistor Q1 mirrors the current sourced by transistor Q2, thereby driving current into output node $N_{OUT}$ to charge up output node $N_{OUT}$ to 5V rather than 3.3V.

On the other hand, when the logic level signal is in a second logic state, transistors Q1, Q2, and Q4 are turned off, while transistor Q3 is turned on. When transistor Q3 turns on, transistor Q3 sinks current from output node $N_{OUT}$.

One of the advantages of circuit 1000 is that, although large gate-to-source voltages $V_{GS}$ can not be used with transistors Q1, Q2, Q3, and Q4 without breaking down the gate oxide, extremely large voltages may be placed on the drains as the breakdown voltages of transistors Q1, Q2, Q3, and Q4, particularly those based on transistors 600 and 900, are extremely large.

Figure 11:
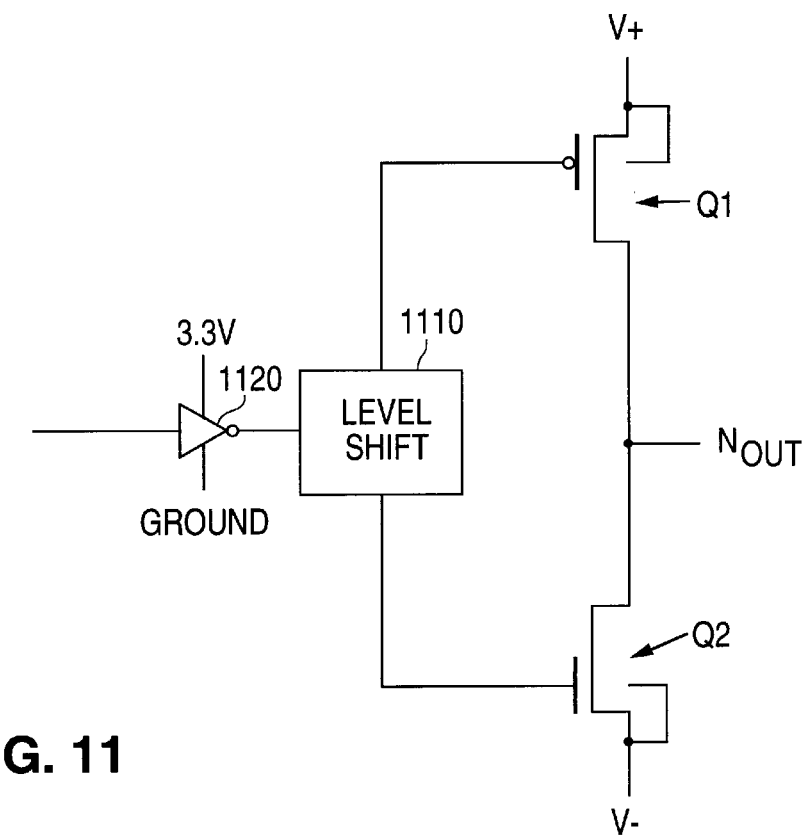
FIG. 11 is a schematic diagram of an output driver circuit 1100 illustrating another example of how devices 400 and 700 can be used to address the 3V/5V tolerance issue in accordance with the present invention.

FIG. 11 shows a schematic diagram of an output driver circuit 1100 that illustrates another example of how devices 400 and 700 can be used to address the 3V/5V tolerance issue. Output driver circuit 1100 may be, for example, an RS232 driver circuit.

As shown in FIG. 11, circuit 1100 includes a high-voltage p-channel transistor Q1 which has a source connected to n-well region 730 and a positive voltage V+ which is greater than the internal supply, a drain connected to an output node $N_{OUT}$, and a gate; and a high-voltage n-channel transistor Q2 which has a source connected to p-well region 430 and a negative voltage V– which is less than ground, a drain connected to output node $N_{OUT}$, and a gate.

Further, circuit 1100 additionally includes a level shift circuit 1110 which has an output connected to the gate of transistor Q1, an output connected to the gate of transistor Q2, and an input, and an inverter 1120 which has an input and an output that is connected to the input of level shift circuit 1110.

In operation, when the logic level signal is in a first logic state, transistor Q1 is turned on, driving the voltage on the output node $N_{OUT}$ up to the positive voltage V+, while transistor Q2 is turned off. When the logic level signal is in a second logic state, transistor Q1 is turned off, while transistor Q2 is turned on, pulling the output node $N_{OUT}$ down to the negative voltage V–.

One of the advantages of circuit 1100 is that a connection can be made between n-well region 730 and source 722 of transistor 720, and between p-well region 430 and source 422 of transistor 420 without interfering with the body potential of the internal circuitry, as is normally the case for RS232 driver products.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:
1. A semiconductor device comprising:
   a semiconductor wafer having:
      a substrate;
      a first layer of insulation material formed on the substrate; and
      layer of semiconductor material formed on the layer of insulation material; and
   a first high-voltage transistor having:
      spaced-apart source and drain regions of a first conductivity type formed in the semiconductor material, the drain region having a first area with a first dopant concentration and a second area with a second dopant concentration which is less than the first dopant concentration, the second area contacting the first layer of insulation material and having a lateral width, the source region including a lightly-doped region, the lightly-doped region having a dopant concentration that is less than the dopant concentration of the second area;
      a first region formed in the semiconductor material between the source and drain regions, the first region having a second conductivity type and a dopant concentration;
      a second layer of insulation material formed on the semiconductor material, the second layer of insulation material having a thickness;

a gate formed on the second layer of insulation material over the first region and a portion of the second area, the gate having sidewalls; and spacers formed to contact the sidewalls of the gate, the spacers having a lateral width, the lateral width of the second area being substantially larger than the lateral width of the spacers.

2. The device of claim 1 and further comprising a second region formed in the semiconductor material, the second region having the second conductivity type, a dopant concentration that is greater than the dopant concentration of the first region, and contacting the source region and the first region.

3. The device of claim 2 wherein the first layer of insulation material includes an oxide.

4. The device of claim 2 wherein the second layer of insulation material includes an oxide.

5. The device of claim 1 wherein the first area is laterally spaced apart from the spacers.

6. A semiconductor device comprising:
   a semiconductor wafer having:
     a substrate;
     a first layer of insulation material formed on the substrate; and
     a layer of semiconductor material formed on the layer of insulation material; and
   a first high-voltage transistor having:
     spaced-apart source and drain regions of a first conductivity type formed in the semiconductor material, the drain region having a first area with a first dopant concentration and a second area with a second dopant concentration which is less than the first dopant concentration, the second area contacting the first layer of insulation material and having a lateral width, the source having a third area with a third dopant concentration and a fourth area with a fourth dopant concentration that is less than the third dopant concentration, the fourth dopant concentration being less than the second dopant concentration;
     a first region formed in the semiconductor material between the source and drain regions, the first region having a second conductivity type and a dopant concentration;
     a second layer of insulation material formed on the semiconductor material, the second layer of insulation material having a thickness; and
     a gate formed on the second layer of insulation material over the first region and a portion of the second area, the gate having sidewalls; and
   a second high-voltage transistor having:
     spaced-apart source and drain regions of the second conductivity type formed in the semiconductor material, the drain region of the second high-voltage transistor having a first area with a first dopant concentration and a second area with a second dopant concentration which is less than the first dopant concentration of the first area of the second high-voltage transistor, the second area of the second high-voltage transistor contacting the first layer of insulation material and having a lateral width, the first area of the first high-voltage transistor being connected to the first area of the second high-voltage transistor;
     a second region formed in the semiconductor material between the source and drain regions of the second high-voltage transistor, the second region having the first conductivity type, and a dopant concentration;
     the second layer of insulation material formed on the semiconductor material; and
     a gate formed on the second layer of insulation material over the second region and a portion of the second area of the second high-voltage transistor.

7. The device of claim 6 and further comprising spacers formed to contact the sidewalls of the gate of the second high-voltage transistor, the spacers of the second high-voltage transistor having a lateral width, the lateral width of the second area of the second high-voltage transistor being substantially larger than the lateral width of the spacers of the second high-voltage transistor.

8. The device of claim 6 wherein the source region of the second high-voltage transistor includes a lightly-doped region, the lightly-doped region of the second high-voltage transistor having a dopant concentration that is less than the dopant concentration of the second area of the second high-voltage transistor.

9. The device of claim 8 and further comprising a third region formed in the semiconductor material, the third region having the first conductivity type, a dopant concentration that is greater than the dopant concentration of the second region, and contacting the source region and the second region of the second high-voltage transistor.

10. A semiconductor device comprising:
    a semiconductor wafer having:
      a substrate;
      a first layer of insulation material formed on the substrate; and
      a layer of semiconductor material formed on the layer of insulation material; and
    a first high-voltage transistor having:
      spaced-apart source and drain regions of a first conductivity type formed in the semiconductor material, the drain region having a first area with a first dopant concentration and a second area with a second dopant concentration which is less than the first dopant concentration, the second area contacting the first layer of insulation material and having a lateral width;
      a first region formed in the semiconductor material between the source and drain regions, the first region having a second conductivity type and a dopant concentration;
      a second layer of insulation material formed on the semiconductor material, the second layer of insulation material having a thickness; and
      a gate formed on the second layer of insulation material over the first region and a portion of the second area, the gate having sidewalls; and
    a low-voltage transistor having:
      spaced-apart source and drain regions of a first conductivity type formed in the semiconductor material, the drain region having a heavily-doped area and a lightly-doped area, the lightly-doped area having a dopant concentration, the dopant concentration of the lightly-doped area being less than the dopant concentration of the second area of the first high-voltage transistor;
      a channel defined between the source and drain regions of the low-voltage transistor;
      a third layer of insulation material formed on the semiconductor material, the third layer of insulation material having a thickness; and
      a gate formed on the third layer of insulation material over the channel.

11. The device of claim 10 wherein the thickness of the second layer of insulation material is greater than the thickness of the third layer of insulation material.

12. A semiconductor device comprising:
a semiconductor wafer having:
- a substrate;
- a first layer of insulation material positioned on the substrate; and
- a layer of semiconductor material positioned on the layer of insulation material; and a first high-voltage transistor having:
- a drain region of a first conductivity type positioned in the semiconductor material, the drain region having a first area with a first dopant concentration and a second area with a second dopant concentration which is less than the first dopant concentration, the second area contacting the first layer of insulation material and having a lateral width;
- a source region of the first conductivity type positioned in the semiconductor material, the source region having a first area with a first dopant concentration and a second area with a second dopant concentration which is less than the first dopant concentration of the source region, the second area of the source region having a lateral width, the second dopant concentration of the source region being less than the second dopant concentration of the drain region;
- a first region positioned in the semiconductor material, the first region contacting the source and drain regions, the first region having a second conductivity type and a dopant concentration;
- a second layer of insulation material positioned on the semiconductor material, the second layer of insulation material having a thickness; and
- a gate positioned on the second layer of insulation material over the first region and a portion of the second area of the drain region, the gate having sidewalls.

13. The device of claim 12 and further comprising spacers formed to contact the sidewalls of the gate, the first area of the drain region being laterally spaced apart from the spacers.

14. The device of claim 12 and further comprising:
a second region positioned in the semiconductor material, the second region having the second conductivity type, a dopant concentration that is greater than the dopant concentration of the first region, and contacting the source region and the first region.

15. The device of claim 14
wherein the drain region includes a first area with a first dopant concentration and a second area with a second dopant concentration which is less than the first dopant concentration, the second area contacting the first layer of insulation material and having a lateral width; and
wherein the source region includes a first area with a first dopant concentration and a second area with a second dopant concentration which is less than the first dopant concentration of the source region, the second area of the source region having a lateral width, the second dopant concentration of the second area of the source region being less than the second dopant concentration of the drain region.

16. The device of claim 15 and further comprising spacers formed to contact the sidewalls of the gate, the first area of the drain region being laterally spaced apart from the spacers.

17. The device of claim 6 wherein the source of the first high-voltage transistor is connected to the first region, and the source of the second high-voltage transistor is connected to the second region.

18. The device of claim 10
wherein the lightly-doped area has a lateral width; and
wherein the lateral width of the second area is greater than the lateral width of the lightly-doped area.

* * * * *

UNITED STATES PATENT AND TRADEMARK OFFICE
CERTIFICATE OF CORRECTION

PATENT NO. : 6,180,983 B1  
DATED : January 30, 2001  
INVENTOR(S) : Richard Billings Merrill Page 1 of 1

It is certified that error appears in the above-identified patent and that said Letters Patent is hereby corrected as shown below:

Column 8,
Line 47, before "the first occurrence of layer" insert -- a --.

Signed and Sealed this

Twenty-eighth Day of August, 2001

*Attest:*

NICHOLAS P. GODICI
*Attesting Officer*  *Acting Director of the United States Patent and Trademark Office*